United States Patent
En et al.

(10) Patent No.: US 6,964,875 B1
(45) Date of Patent: Nov. 15, 2005

(54) ARRAY OF GATE DIELECTRIC STRUCTURES TO MEASURE GATE DIELECTRIC THICKNESS AND PARASITIC CAPACITANCE

(75) Inventors: William G. En, Milpitas, CA (US); Mark W. Michael, Cedar Park, TX (US); Hai Hong Wang, Fremont, CA (US); Simon Siu-Sing Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/962,582

(22) Filed: Oct. 13, 2004

Related U.S. Application Data

(62) Division of application No. 10/021,497, filed on Dec. 19, 2001, now Pat. No. 6,841,832.

(51) Int. Cl.[7] .............................................. H01L 21/66
(52) U.S. Cl. .............................. 438/14; 438/10; 438/17
(58) Field of Search .............................. 438/10, 11, 14, 438/17, 18, 239, 241, 243, 250, 253

(56) References Cited

U.S. PATENT DOCUMENTS

| | | | |
|---|---|---|---|
| 4,975,382 A | 12/1990 | Takasugi | |
| 5,124,271 A | 6/1992 | Havemann | |
| 5,410,161 A | 4/1995 | Narita | |
| 5,585,335 A | 12/1996 | Kitano | |
| 5,679,967 A | 10/1997 | Janai et al. | |
| 5,851,891 A | 12/1998 | Dawson et al. | |
| 5,889,335 A | 3/1999 | Kuroi et al. | |
| 6,015,992 A | 1/2000 | Chatterjee et al. | |
| 6,171,910 B1 | 1/2001 | Hobbs et al. | |
| 6,180,490 B1 | 1/2001 | Vassiliev et al. | |
| 6,207,530 B1 | 3/2001 | Hsu et al. | |
| 6,300,172 B1 | 10/2001 | Ang et al. | |
| 6,396,121 B1 | 5/2002 | Bertin et al. | |
| 6,465,267 B1 * | 10/2002 | Wang et al. | ................... 438/17 |
| 6,522,154 B2 * | 2/2003 | Fifield et al. | ................ 324/678 |
| 6,717,267 B1 | 4/2004 | Kunikiyo | |
| 6,841,832 B1 * | 1/2005 | En et al. | ..................... 257/374 |
| 2001/0016383 A1 | 8/2001 | Chen et al | |

(Continued)

OTHER PUBLICATIONS

"Ellipsometer/reflectometer for Ultra-thin Gate Oxide Metrology," Oct. 1, 2001, http://www.ecnmag.com/ecnmag/issues/2001/10/>, p. 1 of 1.

(Continued)

*Primary Examiner*—Kevin M. Picardat

(57) ABSTRACT

Accurate determination of gate dielectric thickness is required to produce high-reliability and high-performance ultra-thin gate dielectric semiconductor devices. Large area gate dielectric capacitors with ultra-thin gate dielectric layers suffer from high gate leakage, which prevents the accurate measurement of gate dielectric thickness. Accurate measurement of gate dielectric thickness of smaller area gate dielectric capacitors is hindered by the relatively large parasitic capacitance of the smaller area capacitors. The formation of first and second dummy structures on a wafer allow the accurate determination of gate dielectric thickness. First and second dummy structures are formed that are substantially similar to the gate dielectric capacitors except that the first dummy structures are formed without the second electrode of the capacitor and the second dummy structures are formed without the first electrode of the capacitor structure. The capacitance, and therefore thickness, of the gate dielectric capacitor is determined by subtracting the parasitic capacitances measured at the first and second dummy structures.

10 Claims, 6 Drawing Sheets

U.S. PATENT DOCUMENTS

2002/0105051 A1    8/2002    Bertin et al.
2002/0151141 A1    10/2002    Tuan et al.
2002/0177277 A1    11/2002    Baliga
2003/0189255 A1    10/2003    Sugiura et al.

OTHER PUBLICATIONS

Hitachi America, Ltd. Semiconductor Equipment Group . . . , "Customizable Shallow Trench Isolation," p. 1 of 1.

Shallow Trench Isolation, "Trench Isolation," http://courses.nus.edu.sg/course/phy/> pp. 1-4.

Institute of Microelectronics—Deep Submicron—Ultra-thin gate oxides, "Deep Submicron", http://www.ime.org.sg/deep/deep_ultra.htm/>, pp. 1-2.

SNP Applications/Shallow Trench Isolation (STI), "SNP 9000 Applications", htt://www.surfaceinterface.com/snpappsSTI.html>, pp. 1-2.

* cited by examiner

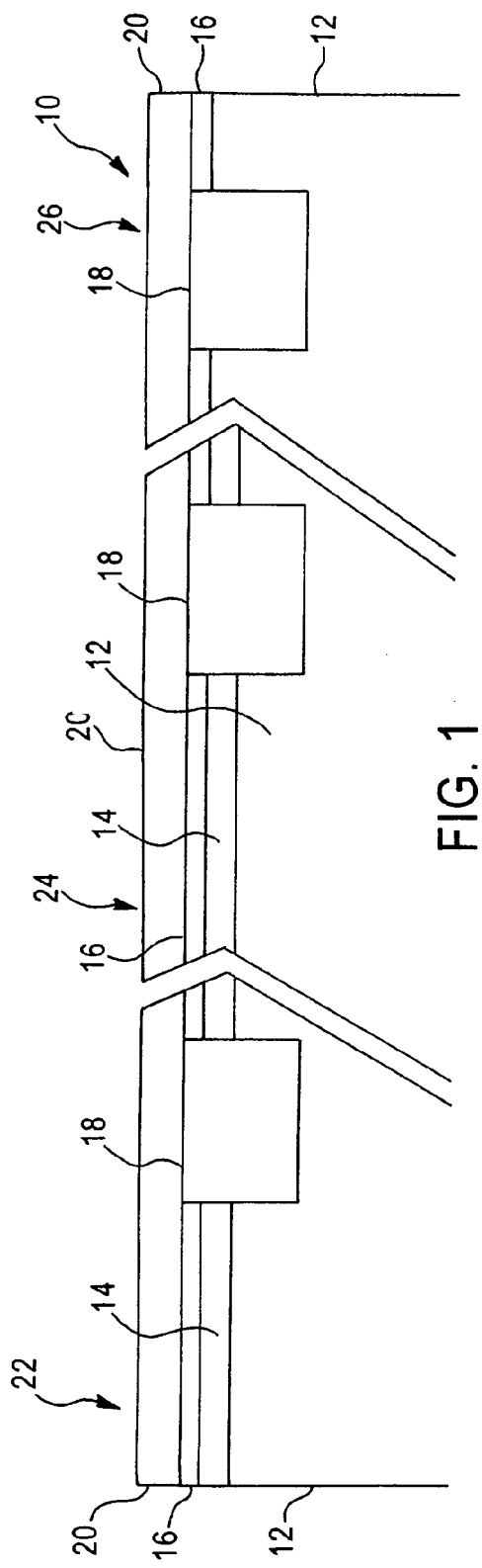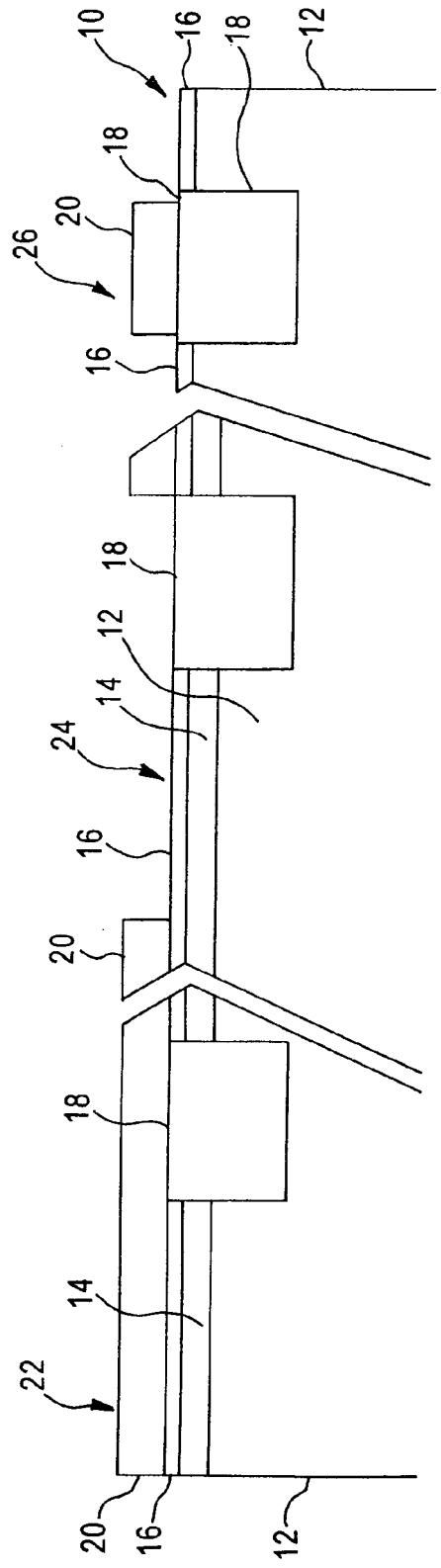

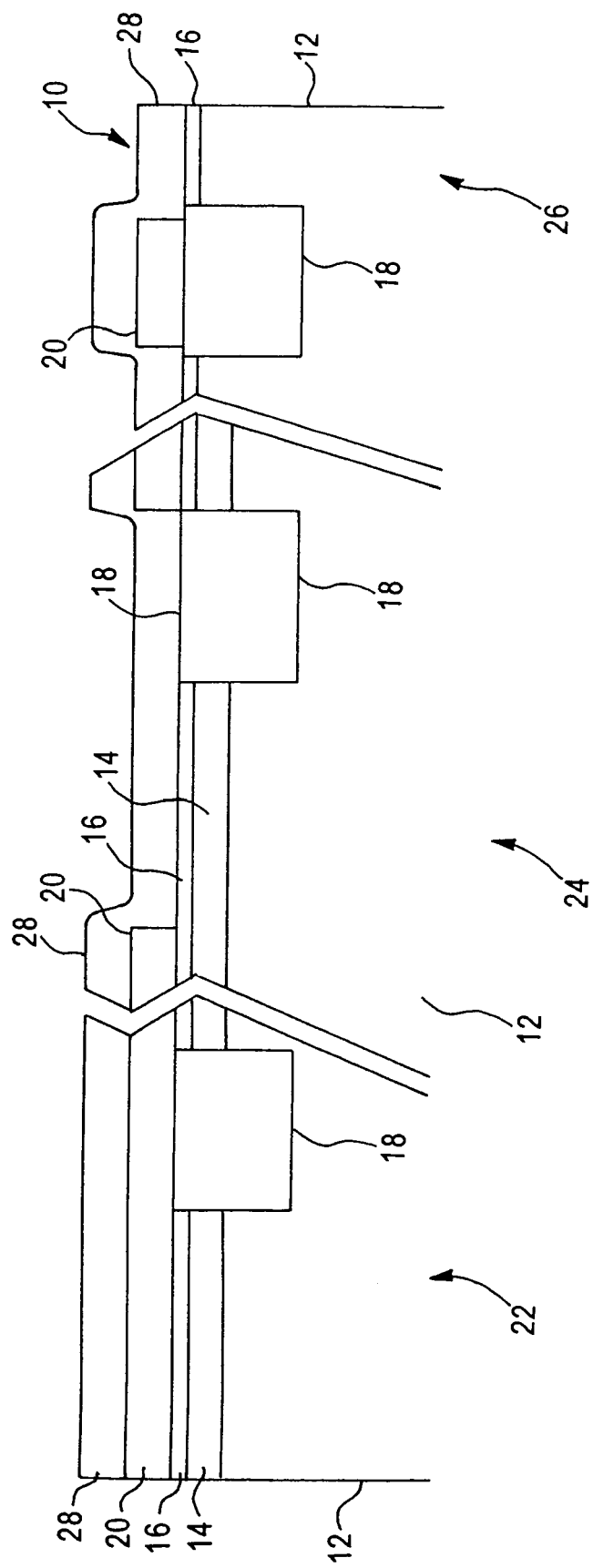

ARRAY OF GATE DIELECTRIC STRUCTURES TO MEASURE GATE DIELECTRIC THICKNESS AND PARASITIC CAPACITANCE

This application is a divisional of application Ser. No. 10/021,497 filed Dec. 19, 2001, now U.S. Pat. No. 6,841,832.

TECHNICAL FIELD

The present invention relates to the field of manufacturing semiconductor devices and, more particularly, to an improved method of measuring gate dielectric thickness and parasitic capacitance.

BACKGROUND OF THE INVENTION

An important aim of ongoing research in the semiconductor industry is the reduction in the dimensions of semiconductor devices. Planar transistors such as metal oxide semiconductor field effect transistors (MOSFET), are particularly well suited for use in high-density integrated circuits. As the size of the MOSFET and other active devices decreases, the dimensions of the gate electrodes and gate dielectric layers decrease correspondingly. Tight control of the gate dielectric thickness is necessary to manufacture reduced-size, high-reliability, high-speed transistors.

Gate dielectric capacitors are commonly used in semiconductor devices. Common gate dielectric capacitors found in a semiconductor device include transistors, such as MOSFET. In order to improve gate dielectric capacitor performance, ultra-thin gate dielectric layers with a thickness below about 25 Å are coupled with large area capacitors. Large area capacitors are typically those with a capacitor area greater than 1000 Å$^2$.

Gate dielectric thickness is an important parameter in gate dielectric capacitor performance. If the gate dielectric thickness is too thin, short-circuiting is a problem. If the gate dielectric layer is too thick, then the device speed will be too slow.

The thickness of the gate dielectric layer can be determined by measuring the capacitance of the gate dielectric capacitor. The thickness of the gate dielectric layer is related to the capacitance by the following formula:

$t = k/C$ wherein t is the thickness of the gate dielectric layer, k is the dielectric constant of the gate dielectric layer, and C is the capacitance of the gate dielectric capacitor.

The capacitance of large area, ultra-thin gate dielectric capacitors cannot be accurately measured directly. The large area gate dielectric capacitors tend to suffer from high gate leakage through the gate. The capacitance of small area gate dielectric capacitors also cannot be directly measured with accuracy. Gate leakage does not appreciably hinder measuring the capacitance of small area gate dielectric capacitors, rather parasitic capacitance interferes with accurate gate dielectric capacitance measurements in small area gate dielectric capacitors. As the area of the gate dielectric capacitor is reduced, the proportion of the total capacitance due to the parasitic capacitance associated with the wiring structures increases.

The term gate dielectric capacitors, as used herein, is not to be limited to the specifically disclosed embodiments. Gate dielectric capacitors, as used herein, include a wide variety of electronic devices in addition to field effect transistors.

The term semiconductor devices, as used herein, is not limited to the specifically disclosed embodiments. Semiconductor devices as used herein, include a wide variety of electronic devices including flip chips, flip chip/package assembly, transistors, capacitors, microprocessors, random access memories, etc. in general, semiconductor devices refer to any electrical device comprising semiconductors.

SUMMARY OF THE INVENTION

There exists a need in the semiconductor device art to accurately measure the gate dielectric thickness of gate dielectric capacitors. There exists a need in this art to accurately measure the capacitance of gate dielectric capacitors. There exists a need in this art to subtract the effects of parasitic capacitance from the overall measured capacitance to obtain the actual capacitance of the gate dielectric capacitor.

These and other needs are met by embodiments of the present invention, which provide a wafer comprising a base layer and an active layer formed on the base layer. A gate dielectric layer is formed on the active layer and a conductive layer is formed on the gate dielectric layer. A plurality of isolation regions are formed in the wafer and the wafer is divided into a plurality of first portions, second portions, and third portions. The first portions comprise gate dielectric capacitors, wherein the gate dielectric capacitor comprises a first electrode layer formed by the active layer, an insulating layer formed by the gate dielectric layer, and a second electrode layer formed by the conductive layer. The second portions comprise first dummy structures, wherein the first dummy structures comprise a first electrode layer formed by the active layer and an insulating layer formed by the gate dielectric layer. The third portions comprise second dummy structures, wherein the second dummy structures comprise an insulating layer formed by an isolation region and a second electrode layer formed by the conductive layer.

The earlier stated needs are also met by other embodiments of the instant invention, which provide a method of measuring the gate dielectric thickness of a gate dielectric capacitor, comprising the steps of providing a wafer comprising a plurality of gate dielectric capacitors, a plurality of first dummy structures, and a plurality of second dummy structures formed on the wafer. The capacitance of one of the gate dielectric capacitors is measured. The capacitance of one of the first dummy structures and one of the second dummy structures is also measured. The capacitance of the first dummy structure and the second dummy structure is subtracted from the capacitance of the gate dielectric capacitor to obtain a difference in capacitance, and the gate dielectric thickness is determined using the difference in capacitance and the known dielectric constant of the gate dielectric.

The earlier stated needs are further met by other embodiments of the instant invention, which provide a method of manufacturing a wafer comprising a plurality of gate dielectric capacitors, first dummy structures, and second dummy structures. The method comprises the steps of providing a wafer comprising a base layer, an active layer formed on the base layer, a gate dielectric layer formed on the active layer, a plurality of isolation regions formed on the wafer, and a conductive layer formed on the gate dielectric layer and the isolation regions. Portions of the conductive layer are removed where the first dummy structures are formed and an intermetal dielectric layer is formed over the conductive layer. Openings are formed in the intermetal dielectric layer to expose the conductive layer, in the regions where the gate dielectric capacitors are formed; the isolation region, in the regions where the first dummy structures are formed; and the conductive layer, in the regions where the second dummy structures are formed. An interconnect layer is formed over the intermetal dielectric layer filling the openings in the intermetal dielectric layer.

This invention addresses the needs for an improved method of measuring the capacitance and gate dielectric thickness of ultra-thin gate dielectric capacitors. The present invention eliminates parasitic capacitance from the gate dielectric capacitance measurements enabling accurate measurement of the gate dielectric capacitor capacitance.

The foregoing and other features, aspects, and advantages of the present invention will become apparent in the following detailed description of the present invention when taken in conjunction with the accompanying drawings.

BRIEF DESCRIPTION OF THE DRAWINGS

FIGS. 1–5 schematically illustrate the formation of a wafer comprising gate dielectric capacitors, first dummy structures, and second dummy structures according to an embodiment of the present invention.

DETAILED DESCRIPTION OF THE INVENTION

Figure 4:
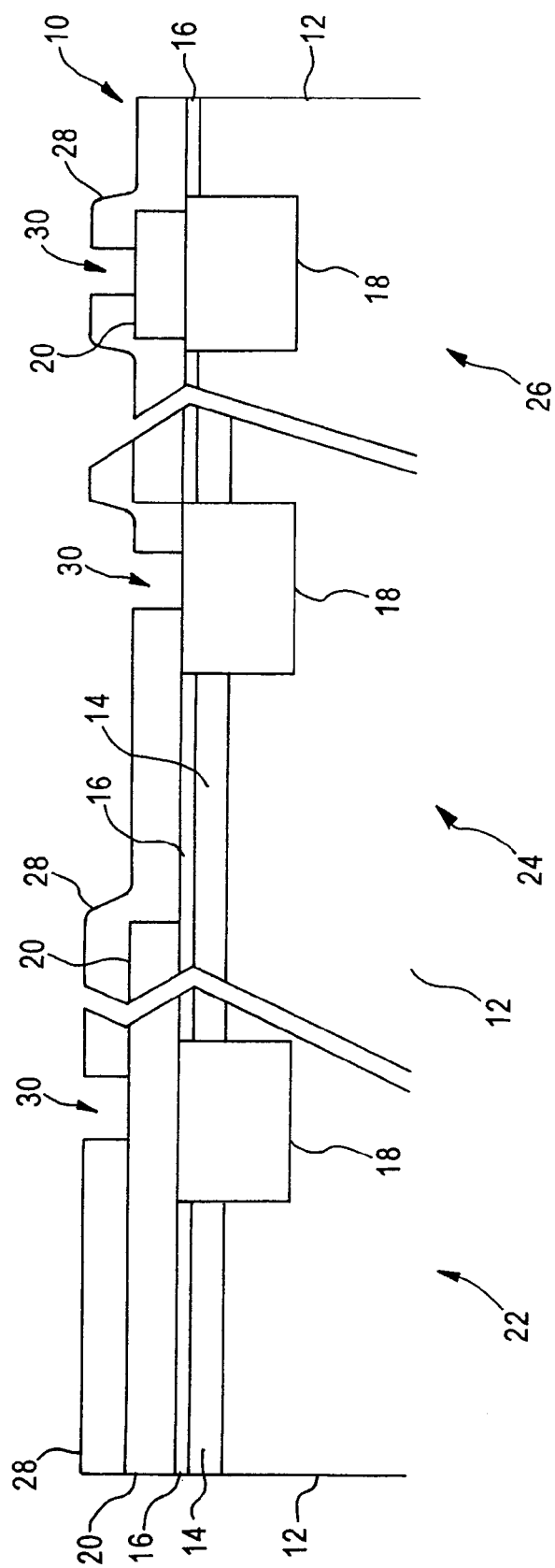

The present invention enables the accurate measurement of the gate dielectric thickness in ultra-thin gate dielectric capacitors. A wafer is provided with dummy structures and a method for eliminating parasitic capacitance from gate dielectric capacitance measurements. The present invention uses two different types of dummy structures so that the parasitic capacitance can be measured and subtracted from the total capacitance of gate dielectric capacitors. The two types of dummy structures that are formed are substantially similar to gate dielectric capacitor devices formed on the wafer, with the exception that the first type of dummy structure does not include one of the capacitor electrodes and the second type of dummy structure does not include the other capacitor electrode.

The invention will be described in conjunction with the formation of a gate dielectric capacitor and first and second dummy structures, as shown in the accompanying drawings. However, this is exemplary only as the claimed invention is not limited to the formation of the specific device illustrated in the drawings.

FIG. 1 illustrates a wafer 10 comprising a plurality of first portions 22, second portions 24, and third portions 26. The wafer 10 is a silicon wafer about 100 μm thick. The wafer 10 comprises a base layer 12 of silicon, an active layer 14 of doped silicon, and a gate dielectric layer 16 formed over active layer 14. In certain embodiments of the instant invention, the gate dielectric layer 16 is formed from a gate oxide, such as by chemical vapor deposition (CVD) or thermal oxidation. In certain alternative embodiments, the gate dielectric layer 16 comprises a nitride dielectric or a high-k dielectric, such as zirconium oxide, hafnium oxide, and stacked nitride. A plurality of isolation regions 18 are formed in the wafer 10 to separate and isolate the various device regions of the wafer. In this example, the gate dielectric capacitor will be formed in the first portion 22, the first dummy structure will be formed in the second portion 24, and the second dummy structure will be formed in the third portion 26. A typical wafer of the present invention comprises a large number of gate dielectric capacitors, depending on the size and specific type of gate dielectric capacitor. As an example, about 5 to about 30 first dummy structures and second dummy structures are formed in various locations throughout the wafer 10, although different numbers of dummy structures may be formed. Isolation regions 18 can be formed by local oxidation of silicon (LOCOS) or shallow trench isolation (STI) techniques. The isolation regions 18, as illustrated in FIG. 1, are formed by STI techniques. STI regions are typically formed by etching trenches in the wafer, forming a thermal oxide liner layer, and then filling the trench with an oxide by CVD. After the trench is filled, the wafer is planarized, typically by chemical-mechanical polishing (CMP).

Subsequent to forming the isolation regions 18, conductive layer 20 is deposited on wafer 10. Conductive wafer layer 20 is formed from epitaxially deposited polysilicon, in exemplary embodiments.

A capacitor comprises a first electrode and a second electrode with an insulating layer separating the two electrodes. In the present invention, the first electrode of the gate dielectric capacitor and the first dummy structure is formed from the active layer 14. The insulating layer is formed from the gate dielectric layer 16. In certain embodiments of the instant invention, the insulating layer is formed from the gate dielectric layer 16 and/or the isolation region 18, as both the gate dielectric layer 16 and the isolation region 18 are formed from silicon oxide. The second electrode in the gate dielectric capacitor and the second dummy structure is formed from the conductive layer 20.

Anisotropic etching is performed on wafer 10 to form the three distinct portions 22, 24, 26. As shown in FIG. 2, the conductive layer 20 is removed from second portion 24 and portions of the conductive layer 20 are removed from third portion 26.

Subsequent to etching conductive layer 20, an intermetal dielectric layer 28 is deposited over wafer 10, as shown in FIG. 3. The intermetal dielectric layer can be a conventional dielectric, such as CVD silicon oxide, spin-on-glass (SOG), or CVD silicon nitride.

As illustrated in FIG. 4, the intermetal dielectric layer 28 is patterned by conventional photolithographic techniques and anisotropically etched to form openings 30 in first portion 22, exposing conductive layer 20; in second portion 24, exposing isolation region 18; and in third portion 26, exposing conductive layer 20.

Figure 5:
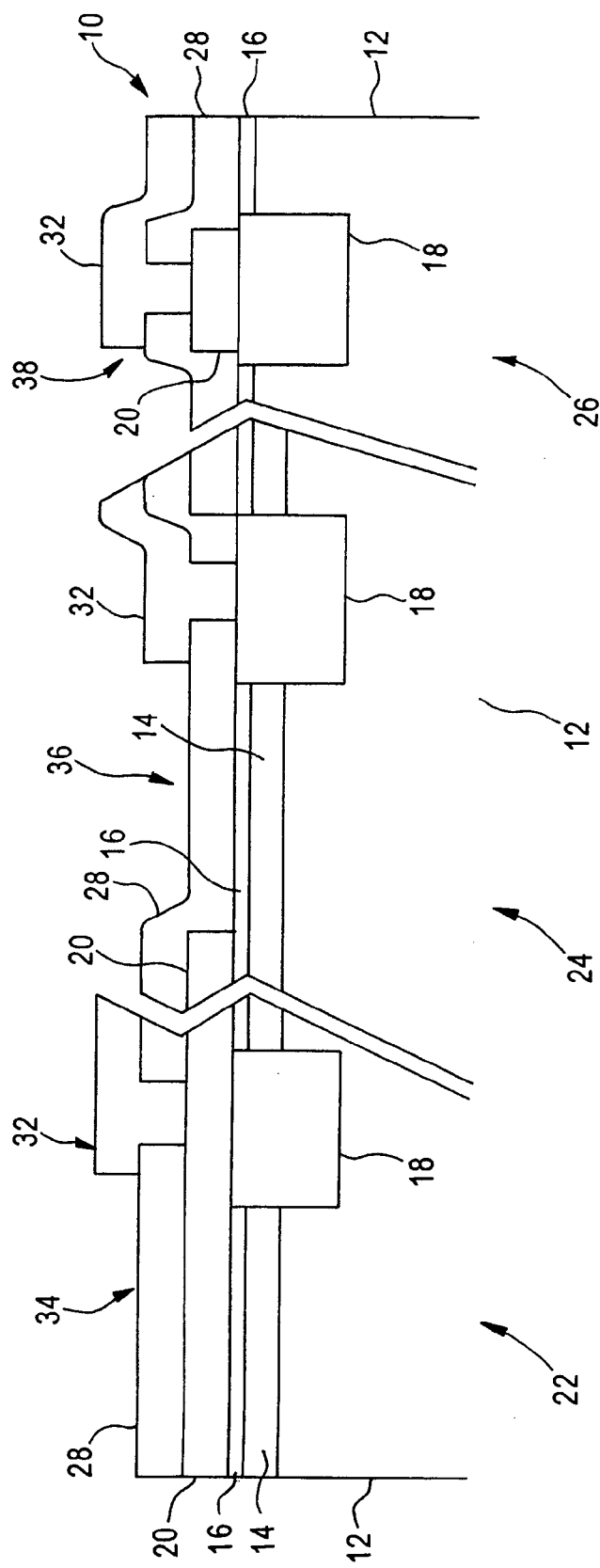

An interconnect layer 32 is deposited over the intermetal dielectric layer 28 and patterned by conventional photolithographic techniques to form gate dielectric capacitor 34, first dummy structure 36, and second dummy structure 38, as illustrated in FIG. 5. Interconnect layer 32 is typically formed from a conductive material, such as a metal. Suitable conductive materials include aluminum, tungsten, copper, and polysilicon, as examples.

Figure 6:
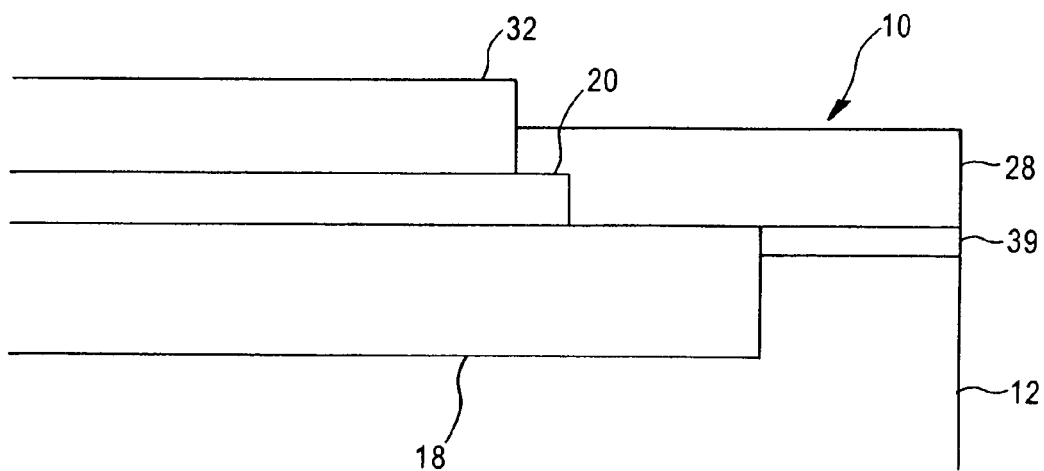
FIG. 6 is a schematic view of the third dummy structure.

The present invention allows gate dielectric thickness to be monitored and measured before the wafer is cut into individual chips. Capacitance is measured across the gate dielectric layer 16 and/or isolation region 18. As the second dummy structure 38 does not contain an active layer, an electrode 39, isolated from active layer 14, is attached to the STI region 18 for the purposes of measuring capacitance. The electrode 39 is formed from a conventional conductive material, such as polysilicon. As shown in a side view along the length of the second dummy structure in FIG. 6, the electrode 39 is a lead extending from the end of the isolation region 18 in the exemplary embodiment.

The first dummy structure 36, termed a "No poly dummy," does not contain a polysilicon electrode. Instead, the interconnect layer 32 directly contacts the oxide layer 16, 18. The second dummy structure 38, termed a "no active dummy" does not contain the doped silicon active layer. Instead, a polysilicon electrode 39 electrically isolated from the active layer 14 is in contact with STI region 18 to measure the capacitance.

The capacitance of the first dummy structure 36 and second dummy structure 38 is added together and then subtracted from the overall capacitance measured at the gate dielectric capacitor 34. The difference in capacitance is used to calculate the thickness of gate dielectric layer 16. Wafers with the proper gate dielectric thickness undergo further processing to form the desired semiconductor devices, while wafers with improper gate dielectric thickness can be rejected or reworked.

Figure 7:
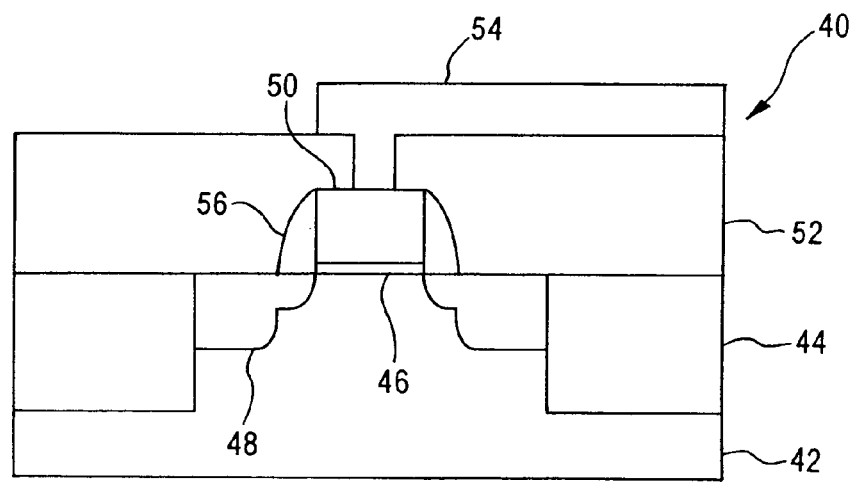
FIG. 7 is a schematic view of a conventional FET.

A field effect transistor (FET) is a typical semiconductor device comprising a gate dielectric capacitor. Field effect transistors can have their gate dielectric thicknesses accurately measured according to this invention. As illustrated in FIG. 7, a FET 40 comprises a base layer 42 of a silicon wafer that corresponds to the base layer 12 of the gate dielectric capacitor 34 illustrated in FIG. 5. The FET 40 further comprises STI regions 44, an intermetal dielectric layer 52, and an interconnect layer 54 in contact with a gate electrode 50. The gate electrode 50 is formed over a gate oxide layer 46, which is formed over the channel 58. The FET 40 further comprises source/drain regions 48 and sidewall spacers 56. The source/drain regions 48 and channel region 58 correspond to the active layer 14 (first electrode layer) of the gate dielectric capacitor 34. The gate oxide layer 46 of the FET 40 corresponds to the gate dielectric layer 16 of the gate dielectric capacitor 34, and the gate electrode 50 corresponds to the conductive layer 20 (second electrode layer) of the gate dielectric capacitor 34. When measuring the capacitance of a typical FET, the first and second dummy structures would substantially correspond to the FET structure 40, with the exception that the first dummy structure would not contain gate electrode 50 and the second dummy structure would not contain source/drain regions 48 and channel region 58.

Figure 8:
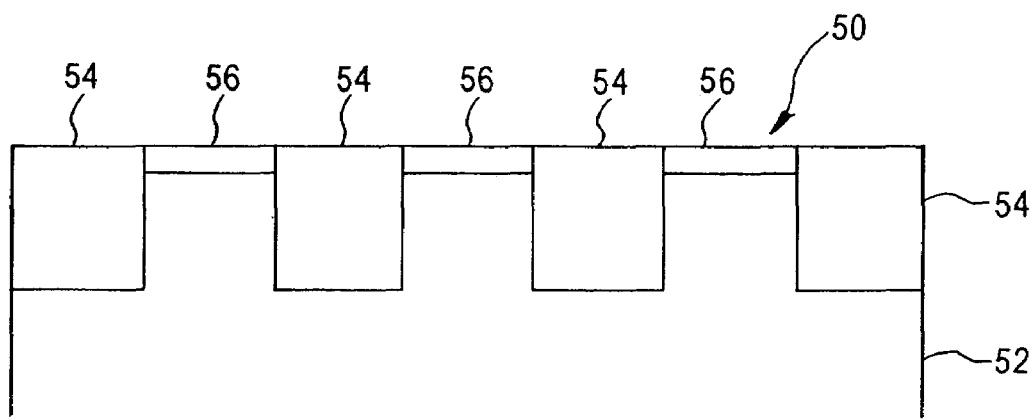
FIGS. 8 and 9 schematically illustrate the formation of a wafer comprising shallow trench isolation regions and various different gate oxide layers.
Figure 9:
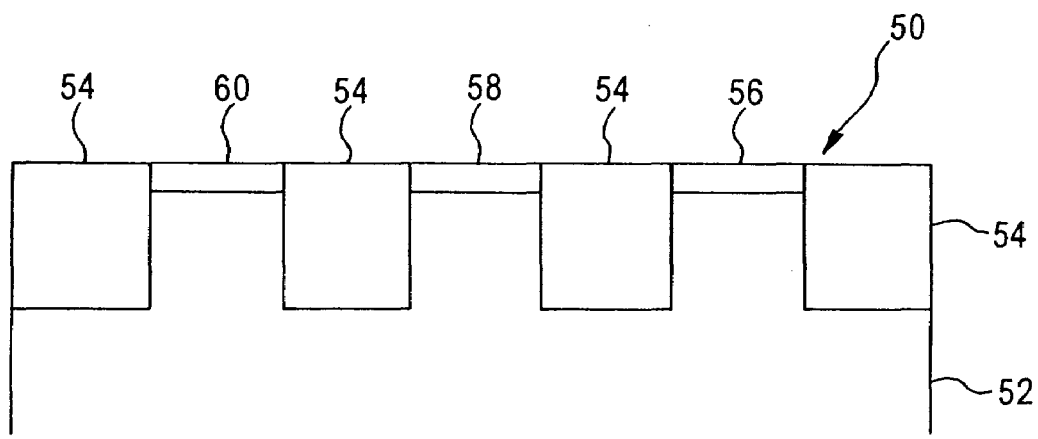

In other embodiments different gate dielectric layers are formed on a wafer comprising shallow trench isolation regions. FIG. 8 illustrates a wafer 150 comprising a silicon base layer 152 and a plurality of shallow trench isolation regions 154. A gate oxide layer 156 is formed on the silicon base layer 152 by thermal oxidation of silicon layer 152 or by silicon oxide deposition techniques. After the formation of the gate oxide layer 156, a mask is formed over the wafer 150 and selected first portions of the gate oxide layer 156 are removed by etching. A first alternate dielectric is subsequently deposited where the first portions of the gate oxide layer 156 were removed. Alternate dielectrics include high-k dielectrics, nitride stack dielectrics, and other known dielectrics. After depositing the first alternate dielectric, the wafer 150 is again masked and second portions of the gate oxide layer 156 are removed by etching. A second alternate dielectric is deposited where the second portions of the gate oxide layer were removed. Masking, etching, and alternate dielectric deposition is repeated until a desired number of different types of dielectric layers are deposited. An exemplary embodiment comprising different types of gate dielectrics is shown in FIG. 9, which comprises a high-k dielectric layer 160, a nitride stack dielectric layer 158, and a gate oxide layer 156.

The wafer and method of the present invention provide improved high-reliability semiconductor devices. The wafer and methods of the present invention allow the accurate determination of gate dielectric thickness to ensure that semiconductor devices with high-performance and high-reliability capabilities are produced.

The embodiments illustrated in the instant disclosure are for illustrative purpose only. They should not be construed to limit the scope of the claims. As is clear to one of ordinary skill in the art, the instant disclosure encompasses a wide variety of embodiments not specifically illustrated herein.

What is claimed is:

1. A method of measuring gate oxide thickness of a gate oxide capacitor comprising:
   providing a wafer comprising a plurality of gate oxide capacitors, a plurality of first dummy structures, and a plurality of second dummy structures formed on said wafer;
   measuring the capacitance of one of said gate oxide capacitors;
   measuring the capacitance of one of said first dummy structures;
   measuring the capacitance of one of said second dummy structures;
   subtracting the capacitance of said first dummy structure and said second dummy structure from the capacitance of said gate oxide capacitor to obtain a capacitance difference; and
   determining the gate oxide thickness from said capacitance difference.

2. The method according to claim 1, wherein said wafer comprises a base layer, an active layer formed on said base layer, a gate oxide layer formed on said active layer, a conductive layer formed on said gate oxide layer, and a plurality of isolation regions.

3. The method according to claim 2, wherein said gate oxide capacitors comprise a first electrode layer formed from said active layer; a dielectric layer formed from said gate oxide layer, and a second electrode formed from said conductive layer;
   said first dummy structures comprise a first electrode layer formed from said active layer, and a dielectric layer formed from said gate oxide layer; and
   said second dummy structures comprise a dielectric layer formed from said isolation region, and a second electrode formed from said conductive layer.

4. The method according to claim 2, wherein said wafer further comprises an intermetal dielectric layer formed on said conductive layer.

5. The method according to claim 4, wherein said wafer further comprises an interconnect layer formed on said intermetal dielectric layer.

6. The method according to claim 2, wherein said active layer comprises doped silicon.

7. The method according to claim 2, wherein said conductive layer comprises polysilicon.

8. A method of manufacturing a wafer comprising a plurality of gate oxide capacitors, first dummy structures, and second dummy structures, the method coprising the steps of:

providing a wafer comprising a base layer, an active layer formed on said base layer, a gate oxide layer formed on said active layer, a plurality of isolation regions formed on said wafer, and a conductive layer formed on said gate oxide layer and said isolation regions;

removing portions of said conductivelyer where said first dummy structures are formed;

forming an intermetal dielectric layer over said conductive layer;

forming openings in said intermetal dielectric layer to expose said conductive layer in a region where said gate oxide capacitors are formed, said isolation region in a region where said first dummy structures are formed, and the conductive layer in a region where said second dummy structures are formed; and forming an interconnect layer over said intermetal dielectric layer, said interconnect layer filling said openings in the intermetal dielectric layer.

9. The method according to claim 8, wherein said isolation regions comprise shallow trench isolation structures.

10. The method according to claim 8, wherein said conductive layer comprises polysilicon.

\* \* \* \* \*